United States Patent [19]

Morita et al.

[11] Patent Number: 4,788,846
[45] Date of Patent: Dec. 6, 1988

[54] PROCESS FOR THE CORRECTION OF CURLS OF FLEXIBLE METAL CLAD LAMINATE AND FOR THE IMPROVEMENT OF ITS DIMENSIONAL STABILITY

[75] Inventors: Moritsugu Morita, Yokosuka; Kazuo Miyazaki, Bibai, both of Japan

[73] Assignee: Mitsui Toatsu Chemicals, Incorporated, Tokyo, Japan

[21] Appl. No.: 127,299

[22] PCT Filed: Mar. 26, 1987

[86] PCT No.: PCT/JP87/00184
§ 371 Date: Oct. 27, 1987
§ 102(e) Date: Oct. 27, 1987

[87] PCT Pub. No.: WO87/05859
PCT Pub. Date: Oct. 8, 1987

[30] Foreign Application Priority Data

Mar. 26, 1986 [JP]  Japan ................................. 61-66049

[51] Int. Cl.[4] ............................ B21D 1/02; B31F 1/00; H05K 3/00
[52] U.S. Cl. ........................................ 72/160; 72/183; 72/342; 72/46; 226/197; 264/285; 493/459; 29/846
[58] Field of Search .................. 72/160, 162, 183, 342, 72/46; 226/197, 189; 264/280, 285, 231, 339; 162/271, 270; 493/459, 461; 29/846

[56] References Cited

U.S. PATENT DOCUMENTS

| | | | |
|---|---|---|---|
| 2,495,909 | 1/1950 | Ross | 226/197 |
| 3,179,634 | 4/1965 | Edwards | 260/78 |
| 3,559,438 | 2/1971 | Rouyer et al. | 72/160 |
| 4,060,236 | 11/1977 | Carstedt | 72/160 |
| 4,106,166 | 8/1978 | Henning | 162/271 |
| 4,300,891 | 11/1981 | Bemiss | 493/461 |
| 4,517,042 | 5/1985 | Singer | 156/555 |
| 4,528,833 | 7/1985 | Inaike et al. | 493/459 |

FOREIGN PATENT DOCUMENTS

| | | |
|---|---|---|
| 962037 | 4/1957 | Fed. Rep. of Germany ...... 162/270 |
| 129862 | 12/1974 | Japan . |
| 31480 | 3/1979 | Japan . |
| 66966 | 5/1979 | Japan . |
| 108272 | 8/1979 | Japan . |
| 72095 | 5/1980 | Japan . |
| 160489 | 12/1980 | Japan . |
| 23791 | 3/1981 | Japan . |
| 190091 | 11/1983 | Japan . |
| 22389 | 2/1984 | Japan . |

Primary Examiner—Daniel C. Crane
Attorney, Agent, or Firm—Fisher, Christen & Sabol

[57] ABSTRACT

A long flexible metal clad laminate, which has a thin aromatic polyimide film formed on a long metal foil, is caused to slide under tension, along its length, on curved surfaces of four bars arranged at specific positions, so that its curls are corrected and its dimensional stability is improved.

8 Claims, 3 Drawing Sheets

FIG. 1

PROCESS FOR THE CORRECTION OF CURLS OF FLEXIBLE METAL CLAD LAMINATE AND FOR THE IMPROVEMENT OF ITS DIMENSIONAL STABILITY

DESCRIPTION

1. Technical Field

This invention relates to a process for the correction of curls of a long flexible metal clad laminate (hereinafter called "FMCL"), which has excellent heat resistance, electrical properties and mechanical properties and comprises a metal clad polyimide film, and for the improvement of its dimensional stability. More specifically, this invention is concerned with a process for effecting continuously the correction of curls occurred in a long adhesiveless flexible metal clad laminate (hereinafter called "A-FMCL"), which has been produced by forming a thin film layer of an aromatic polyimide on a metal foil, and the minimization of size reduction of the thin polyimide layer which size reduction takes place upon etching of the metal foil.

2. Background Art

Flexible metal clad laminates are substrates suitable for use in the fabrication of flexible printed circuits and have found an increasing demand in recent years reflecting the size reduction of packages for enclosing printed circuits therein. Such flexible metal clad laminates have heretofore been produced by bonding a polyimide film on a metal foil by means of an adhesive. These laminates are accompanied by a problem that although the polyimide film has sufficient heat resistance, electrical properties and mechanical properties, these properties of the polyimide film are not fully utilized due to insufficient properties of the adhesive.

Accordingly, it has conventionally been investigated to develop a process for producing A-FMCL in which a thin polyimide film and a metal foil make up directly a laminate without interposition of any adhesive layer. U.S. Pat. No. 3,179,634 and Japanese Patent Laid-Open Nos. 129,862/1974, 190,091/1983 and 190,092/1983 maybe mentioned by way of example. Since these processes are simple by themselves and do not require the provision of an adhesive layer, various properties of a resulting A-FMCL reflect various excellent properties of a polyimide used. It has another merit that the reduction of bonding strength of the polyimide with the metal foil does not take place too much even at elevated temperatures.

Figures 4, 5:
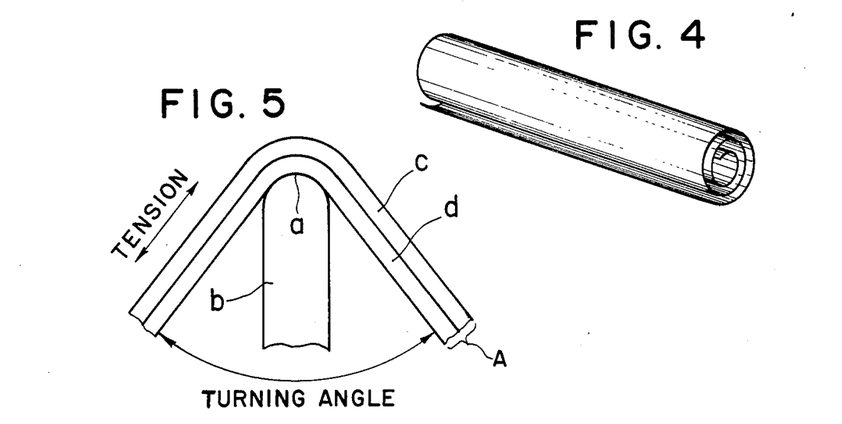
FIG. 4 is a schematic illustration depicting a curled external appearance of an A-FMCL.
FIG. 5 is a schematic illustration showing a laminate moving under tension on a curved surface of a bar with its polyimide layer outside and its metal foil layer inside.

A-FMCLs, which have been produced as described above and have no adhesive layer, are however accompanied by a drawback that they develop curls which are very troublesome for the fabrication of circuits. This curling takes place due to a difference in size between a polyimide layer and its associated metal foil, which difference is in turn caused by a volume shrinkage occurring unavoidably on the side of the polyimide layer in the course of production of the laminate. Generally, a laminate has a carpet-like appearance rolled up with its metal foil outside as shown in FIG. 4. The thus-curled laminate is accompanied by a drawback that the size reduction of the polyimide film, which occurs upon etching of the metal foil, is very large, i.e., as large as about 0.3–1.0% (as measured in accordance with the method of IPC FC 240). These curling and size reduction are serious drawbacks of flexible metal clad laminates. These drawbacks render the handling of the laminates inconvenient in the screen printing step, chemical etching steps and the like and also damage the resist layers and cause cutting and short-circuiting of conductive elements, whereby the processing of circuits is rendered difficult.

A variety of improvements has hence been proposed to avoid the occurrence of such curling or to reduce curls occurred so as to obtain flatness free of problems to the formation of circuits and such dimensional stability that the size reduction of a polyimide film is 0.1% or lower.

It is possible to avoid completely the volume shrinkage due to the ring-closing reaction of a polyamide acid, a precursor of polyimide, for example, by cast-coating a metal foil with a solvent-soluble aromatic polyimide. Even if this method is followed, the curling and the size reduction of the polyimide upon etching of the metal foil occur due to evaporation of the solvent and the difference in linear coefficient of expansion between the polyimide and metal foil and the above problems still remain unsolved.

On the other hand, it has also been known to correct curls already occurred. As examples, may be mentioned Japanese Patent Laid-Open Nos. 66,966/1979, 108,272/1979, 72,095/1980, 160,489/1980 and 23,791/1981. These methods are however unsuitable for correcting curls occurred in a long A-FMCL, because they require a heat treatment at an elevated temperature for a a long period of time.

It has also been known to correct curls in a long A-FMCL. Japanese Patent Laid-Open No. 31,480/1979 may be mentioned by way of example. In this method, stretching or rolling is effected under such temperature conditions that the resin layer is softened, for example, heating the long A-FMCL to a high temperature near the glass transition temperature or to a temperature of at least 100° C. in the presence of a remaining solvent. Therefore, curling tends to occur again after the curl-correcting processing due to the difference in coefficient of linear expansion between the thin resin layer and the metal foil or the complete removal of the remaining solvent. In Japanese Patent Laid-Open No. 22,389/1984, a curl-correcting processing is effected at a low temperature of 80° C. or lower without using any solvent. Accordingly, this method is suited for a long substrate and is free from recurrence of curling after the curl-correcting processing. This method comprises causing a long substrate to slide aa long the length thereof, with its metal foil inside, on a curved large surface of a bar, said surface having a radius of curvature of 0.5–25 mm, while applying an extremely small tension of 20–200 g/cm in general to the long substrate, whereby curls are corrected by making use of slight plastic deformations occurred in the metal foil.

According to the above method, the metal foil is subjected to slight plastic deformations but the thin resin film does not undergo any substantial plastic deformation. The correction of curls is therefore effected only by a flattening action which makes use of the slight plastic deformations of the metal foil, and a residual shrinkage stress caused by a shrinkage in volume still remains in the thin resin layer. When the metal foil of the substrate is etched to form a circuit, the metal foil which has stretched the thin plastics layer is removed. The thin plastics layer then begins to undergo a substantial shrinkage due to a residual shrinkage stress at the etched area. On the other hand, the thin resin layer bonded to the circuit portion of the metal foil does not shrink. As a result, the resultant circuit substrate develops a number of wrinkles, ruggedness and the like so that considerable problems will be encountered in handling the circuit substrate in steps subsequent to the etching step, such as overlay step, solder resist step and parts mounting step.

DISCLOSURE OF THE INVENTION

An object of this invention is to provide a process for effectively and continuously correcting or reducing the problem of curling, which occurs in a long A-FMCL produced by forming a thin film layer of an aromatic polyimide directly on a metal foil, and also the problem of size reduction of the thin polyimide layer which arises upon etching the metal foil.

The above object can be achieved by the following process: A process for the correction of curls of a long A-FMCL, which has a thin aromatic polyimide film formed directly on a long metal foil without any adhesive interposed therebetween, and for the improvement of the dimensional stability thereof, characterized in that said process comprises the steps, performed at least once per step in any arbitrary order, of (1) causing the A-FMCL to slide under tension, along the length thereof, with the metal foil inside, on a curved surface of a first bar arranged at an angle (line angle) of 30-60 degrees relative to the width of the A-FMCL; (2) causing the A-FMCL to slide under tension, along the length thereof, with the metal foil inside, on a curved surface of a second bar arranged at an angle (line angle) of 60-120 degrees relative to the first bar; (3) causing the A-FMCL to slide under tension, along the length thereof, with the polyimide film inside, on a curved surface of a third bar (or a first rotating roll for obtaining smoother sliding) arranged at an angle (line angle) of 30-60 degrees relative to the width of the A-FMCL; and (4) causing the A-FMCL to slide under tension, along the length thereof, with the polyimide film inside, on a curved surface of a fourth bar or second rotating roll arranged at an angle of 60-120 degrees relative to the third bar (or the first rotating roll for obtaining smoother sliding).

BEST MODES FOR CARRYING OUT THE INVENTION

The first step~fourth step can be performed in any arbitrary order in the present invention. A preferred embodiment of this invention may however be a process for performing the above steps at least once per step in the order of the first step, second step, third step and fourth step or a process for performing the above steps at least once per step in the order of the first step, third step, second step, and fourth step. Many orders are however feasible other than the above-described orders of steps, for example, a further order of the first step, second step, third step, fourth step, first step, third step, second step, first step, fourth step, third step, fourth step and third step, and a still further order of the first step, second step, first step, second step, third step and fourth step.

More preferably, a step for aging in an atmosphere of 100° C. or higher for 30 minutes or a longer is practiced subsequent to the last step.

The principled technical concept of this invention resides in that when a laminate A moves along the periphery of circle, under tension, with a polyimide layer c out and a metal foil layer d in, on a curved surface a of a bar b, said curved surface a having a particular radius curvature as illustrated in FIG. 5, the elongation of the outer polyimide layer c is rendered substantially greater compared with the elongation of the inner metal foil d so as to apply a permanent stretched plastic deformation to the polyimide layer c. The degree of the deformation is controlled greater than the corresponding plastic deformation of the metal foil d, thereby making the length of the polyimide layer c in a plane substantially equal to the length of the metal foil d and hence decreasing the size reduction of the laminate.

Figure 6:
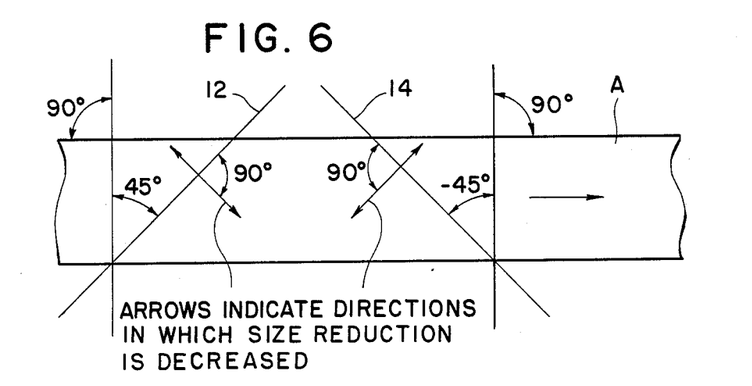
FIG. 6 is a drawing showing schematically the directions in which the size reduction decreases when the laminate moves past a first bar and second bar respectively.

Upon practice of the above technical concept, it is essential to perform it by separating same into the first step and second step. This is shown in FIG. 6 by way of example. In the first step, the size reduction of the laminate A decreases in a direction perpendicular to a first bar arranged at 45° relative to the advancing direction of the laminate A after the laminate A has passed by the first bar. In the second step, the size reduction of the laminate A decreases in a direction perpendicular to a second bar arranged at −45° relative to the advancing direction of the laminate A after the laminate A has passed by the second bar. In the manner described above, the size reduction of the laminate decreases in all planar directions by having the laminate A pass by both first and second bars. The degree of the decrease of the size reduction can be adjusted by controlling the tensile force and speed upon sliding movement of the laminate A in the advancing direction on the bar and number of sliding movements of the laminate A the tensile force applied to the laminate A shown in FIG. 5, and the turning angle of the laminate A when the laminate A is turned along the bar, etc.

Use of the first and second steps alone is however effective only for making the sizes of the polyimide layer and metal foil layer substantially equal. Due to plastic deformations remaining in the metal foil, the laminate develops curling in a direction opposite to the initial curling, namely, with the metal foil inside. The third and fourth steps are thus practised, whereby slight plastic deformations can be developed in the metal foil without causing no substantial permanent stretch and plastic deformations to occur in the polyimide layer so that the curling is corrected and the laminate is flattened. The degree of correction of this reverse curling can be adjusted in the same manner as the correction of the initial curling.

Subsequent to the above correction of curls and decrease of size reduction by making use of plastic deformations, the resultant laminate may preferably be aged at a temperature of at least about 100° C. if necessary. The purpose of this aging is to eliminate small tentative deformations of the polyimide other than its stretch deformations caused as a result of passing of the laminate by the bars. In the manner mentioned above, it is possible to achieve both correction of curls and decrease of size reduction (hereinafter called "improvement to the dimensional stability") of the A-FMCL.

No substantial deterioration however arises as to the quality of the A-FMCL such as bonding properties and film properties by the correction of curls, which is accompanied by plastic deformations.

In the present invention, the aromatic polyimide of the thin film layer formed on the metal foil is a polymer obtained from an aromatic tetracarboxylic dianhydride and an aromatic diamine. No particular limitation is imposed thereon. Among such polyimides, may be mentioned as a particularly preferred polyimide a polymer obtained by mixing a symmetric aromatic meta-substituted primary diamine (hereinafter abbreviated as "m-diamine") and a symmetric aromatic para-substituted primary diamine (hereinafter abbreviated as "p-diamine") at an equivalent ratio of 10–60:90–40 and then reacting the resulting mixture with an aromatic tetracarboxylic dianhydride. Also included as suitable polymers are polymers obtained individually from a pyromellitic dianhydride containing a recurring unit represented by the following general formula (I) or (IV) and an aromatic diamine, polymers obtained individually from a 3,3',4,4'-benzophenonetetracarboxylic dianhydride containing a recurring unit represented by the following general formula (II) or (V) and an aromatic diamine, as well as polymers obtained individually from a 3,3',4,4'-biphenyltetracarboxylic dianhydride containing a recurring unit represented by the following general formula (III) or (VI) and an aromatic diamine

(I)

(II)

(III)

(IV)

(V)

wherein X means O, SO₂, S, CO, CH₂, C(CH₃)₂, C(CF₃)₂ or a direct bond.

As illustrative examples of the aromatic diamines represented by the above general formulae respectively, may be mentioned 4,4′-diaminodiphenylmethane, 4,4′-diaminodiphenyl ether, 4,4′-diaminodiphenyl sulfone, 3,3′-diaminodiphenylmethane, 3,3′-diaminodiphenyl ether, 3,3′-diaminodiphenyl sulfone, etc. Incidentally, it is not necessary to use a single kind of aromatic polyimide. It may be feasible to use a mixture of two or more aromatic polyimides of different kinds.

The above-mentioned m-diamine may be represented by any one of the following general formulae:

wherein X denotes O, SO₂, SO, S, CO, CH₂, C(CH₃)₂, C(CF₃)₂ or a direct bond and the individual Xs may be the same or different.

As illustrative examples of the m-diamines represented by the above general formulae respectively, may be mentioned 3,3′-diaminodiphenyl ether, 3,3′-diaminodiphenyl sulfide, 3,3′-diaminodiphenyl sulfoxide, 3,3′-diaminodiphenyl sulfone, 3,3′-diaminobenzophenone, bis[4-(3-aminophenoxy)phenyl]methane, 2,2-bis[4-(3-aminophenoxy)phenyl]propane, 2,2-bis[4-(3-aminophenoxy)phenyl]-1,1,1,3,3,3-hexafluoropropane, 1,3-bis(3-aminophenoxy)benzene, 4,4′-bis(3-aminophenoxy)biphenyl, bis[4-(3-aminophenoxy)phenyl]ketone, bis[4-(3-aminophenoxy)phenyl]sulfide, bis[4-(3-aminophenoxy)phenyl]sulfoxide, bis[4-(3-aminophenoxy)phenyl]sulfone, bis[4-(3-aminophenoxy)phenyl]ether, 4,4′-bis(3-aminophenylsulfonyl)diphenyl ether, 4,4′-bis(3-aminothiophenoxy)diphenyl sulfone, 1,4-bis[4-(3-aminophenoxy)benzoyl]benzene, etc. They may be used either singly or in combination.

The p-diamine which is used as a mixture with the m-diamine can be represented by any one of the following general formulae:

wherein X means O, SO₂, SO, S, CO, CH₂, C(CH₃)₂, or C(CF₃)₂ and the individual Xs may be the same or different.

Illustrative examples of the p-diamines represented by the above general formulae respectively include 4,4′-diaminodiphenyl ether, 4,4′-diaminodiphenyl sulfide, 4,4′-diaminodiphenyl sulfoxide, 4,4′-diaminodiphenyl sulfone, 4,4′-diaminobenzophenone, bis[4-(4-aminophenoxy)phenyl]methane, 2,2-bis[4-(4-aminophenoxy)phenyl]propane, 2,2′-bis[4-(4-aminophenoxy)biphenyl phenyl]-1,1,1,3,3,3-hexafluoropropane, 1,3-bis(4-aminophenoxy)benzene, 4,4′-bis(4-aminophenoxy)biphenyl, bis[4-(4-aminophenoxy)phenyl]ketone, bis[4-(4-aminophenoxy)phenyl]sulfide, bis[4-(4-aminophenoxy)phenyl]sulfoxide, bis[4-4-aminophenoxy)phenyl]sulfone, bis[4-(4-aminophenoxy)phenyl]ether, 4,4′-bis(4-aminophenylsulfonyl)diphenyl ether, 4,4′-bis(4-aminothiophenoxy)diphenyl sulfone, 1,4-bis[4-(4-aminophenoxy)benzoyl]benzene, and so on. They may be used either singly or in combination.

As the aromatic tetracarboxylic anhydride to be reacted with the diamine, may be used pyromellitic dianhydride, 3,3′,4,4′-benzophenonetetracarboxylic dianhydride, 2,2′,3,3′-benzophenonetetracarboxylic dianhydride, 3,3′,4,4′-biphenyltetracarboxylic dianhydride, 2,2′,3,3′-biphenyltetracarboxylic dianhydride, 2,2-bis(3,4-dicarboxyphenyl)propane dianhydride, 2,2-bis(2,3-dicarboxyphenyl)propane dianhydride, bis(3,4-carboxyphenyl) ether dianhydride, bis(3,4-dicarboxyphenyl) sulfone dianhydride, 1,1-bis-(2,3-dicarboxyphenyl)ethane dianhydride, bis(2,3dicarboxyphenyl)methane dianhydride, bis(3,4-dicarboxyphenyl)methane dianhydride, 2,3,6,7-naphthalenetetracarboxylic dianhydride, 1,4,5,8-naphthalenetetracarboxylic dianhydride, 1,2,5,6-naphthalenetetracarboxylic dianhydride, 1,2,3,4-benzenetetracarboxylic dianhydride, 3,4,9,10-perillenetetracarboxylic dianhydride, 2,3,6,7-anthracenetetracarboxylic dianhydride, 1,2,7,8-phenanthrenetetracarboxylic dianhydride, etc. They may be used either singly or in combination.

In order to form the thin film layer of the aromatic polyimide on the long metal foil without interposing any adhesive layer so as to produce the A-FMCL according to the present invention, any one of the following methods may be used. It should however be borne in mind that the present invention is not limited particularly to the use of the following methods.

(1) After coating the metal foil directly with an organic solvent solution of a polyamide acid which has been formed by reacting an aromatic diamine and an aromatic tetracarboxylic dianhydride and is a precursor of a polyimide, the thus-coated solution is subjected to heating, desolvation, and elimination of water occurred by the ring-closing reaction of the polyamide acid so that the film layer is formed.

(2) A solution of a polyimide is prepared by reacting an aromatic diamine and an aromatic tetracarboxylic dianhydride in a known solvent such as a phenol-type solvent, and the metal foil is coated directly with the solution, followed by heating and desolvation to form the film layer.

The above heating and dewatering or heating and desolvation are generally carried out at 150°–400° C. and the thickness of the resultant aromatic polyimide layer is usually 10–100 μm. It is also possible to form a laminate by hot press lamination of a thermoplastic polyimide film directly on a metal foil.

As the long metal foil employed in the present invention, a copper foil or aluminum foil is used generally. It is however also possible to use a foil of another conductive metal such as nickel foil. The foil thickness may generally range from 10 μm to 100 μm.

The long A-FMCL produced by forming the thin film layer of the aromatic polyimide directly on the long metal foil without interposition of any adhesive layer is accompanied by strong curling with the metal foil outside along both length and width thereof. When the metal foil of the A-FMCL is subjected to etching, a substantial reduction in size occurs in the thin film layer of the polyimide.

In order to facilitate the understanding of the present invention, the present invention will hereinafter be described specifically with reference to the accompanying drawings.

Figure 1:
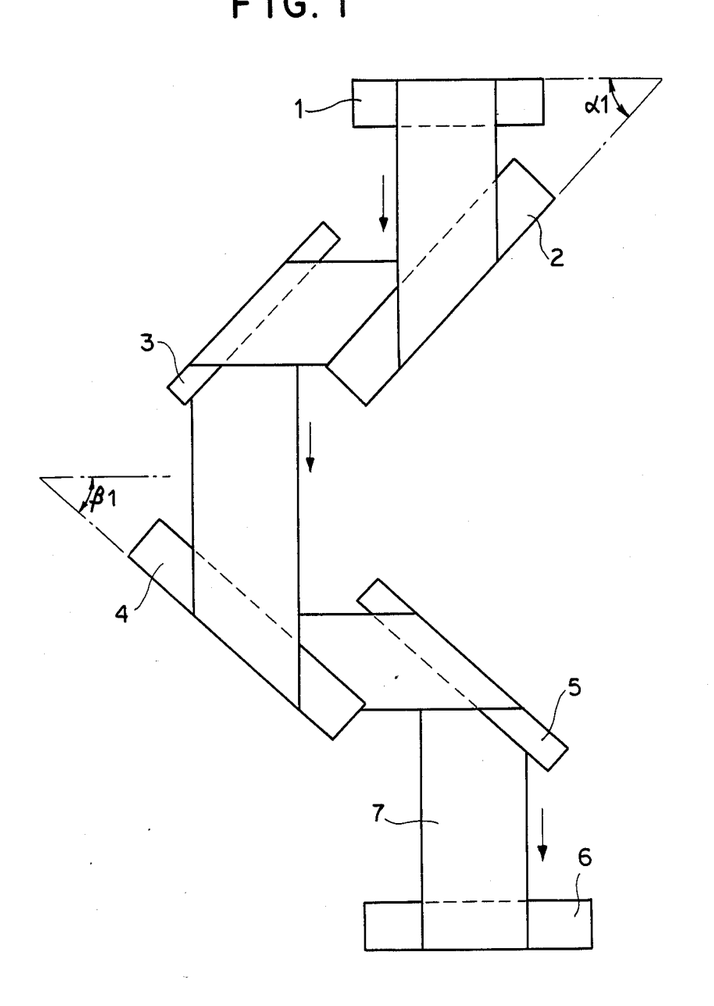
FIGS. 1 and 2 are individually a schematic illustration showing the manner of practice of curl correction and dimensional-stability improvement of an A-FMCL according to this invention.
Figure 8:
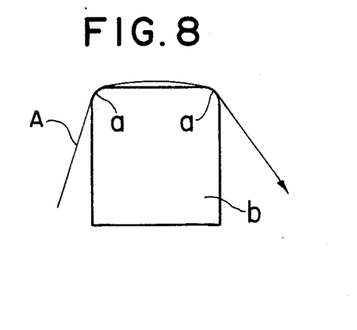

FIG. 1 is a schematic illustration showing by way of example the manner of practice of curl correction and dimensional-stability improvement by stretching a polyimide film greater compared with its associated metal foil by using as a first and second bars glass plates having a round-cornered rectangular cross-section such as that depicted in FIG. 8.

An A-FMCL 7 which has been wound on a roll 1 travels in a direction indicated by an arrow, and with the side of a metal foil maintained in contact with a corner (the radius of curvature of the corner being smaller than 0.5 mm) of a first bar 2 arranged at $\alpha_1$ of 30–60 degrees, preferably, 40–50 degrees relative to the width of the substrate (in FIG. 1, the first bar is arranged in such a way that $\alpha_1$ relative to the width of the substrate is 45 degrees), the substrate is turned at a turning angle, for example, 60 degrees (namely, in a state that a plane of the substrate which is being fed to the first bar 2 and another plane of the substrate which is traveling past the first bar 2 cross at an angle of 60 degrees). The substrate which has travelled past the first bar 2 then travels to a first rotating roll 3 arranged at an angle of $-10-+10$ degrees relative to the first bar (in FIG. 1, the first rotating roll is arranged in a relation parallel to the first bar 2) and is turned at a turning angle of 60 degrees with the polyimide film maintained in contact with a curved surface (the radius of curvature being 25 mm or smaller) of the first rotating roll. The substrate which has travelled past the rotating roll 3 travels in a direction of an arrow and is turned at a turning angle of 60 degrees with the side of the metal foil maintained in contact with a corner (the radius of curvature of the corner portion being 0.5 mm or smaller) of a second bar 4 arranged at an angle of 30–60 degrees, preferably, 40–50 degrees relative to the width of the substrate (in FIG. 1, the second bar is arranged in such a way that $\beta_1$ to the width of the substrate is 45 degrees). The substrate which has travelled past the second bar 4 then travels to a second rotating roll 5 arranged at an angle of $-10-+10$ degrees relative to the second bar (in FIG. 1, the second rotating roll is arranged in a relation parallel to the second bar 4) and is turned at a turning angle of 60 degrees with the polyimide film maintained in contact with its curved surface (the radius of curvature being smaller than 25 mm). The substrate which has travelled past the second rotating roll 5 travels further in a direction of an arrow and is taken up on a roll 6.

If the line angle is too small, the improvement to the transverse dimensional stability is smaller than that to the longitudinal dimensional stability. If the line angle is too large, another problem opposite to the above problem arises.

Figures 2, 3:
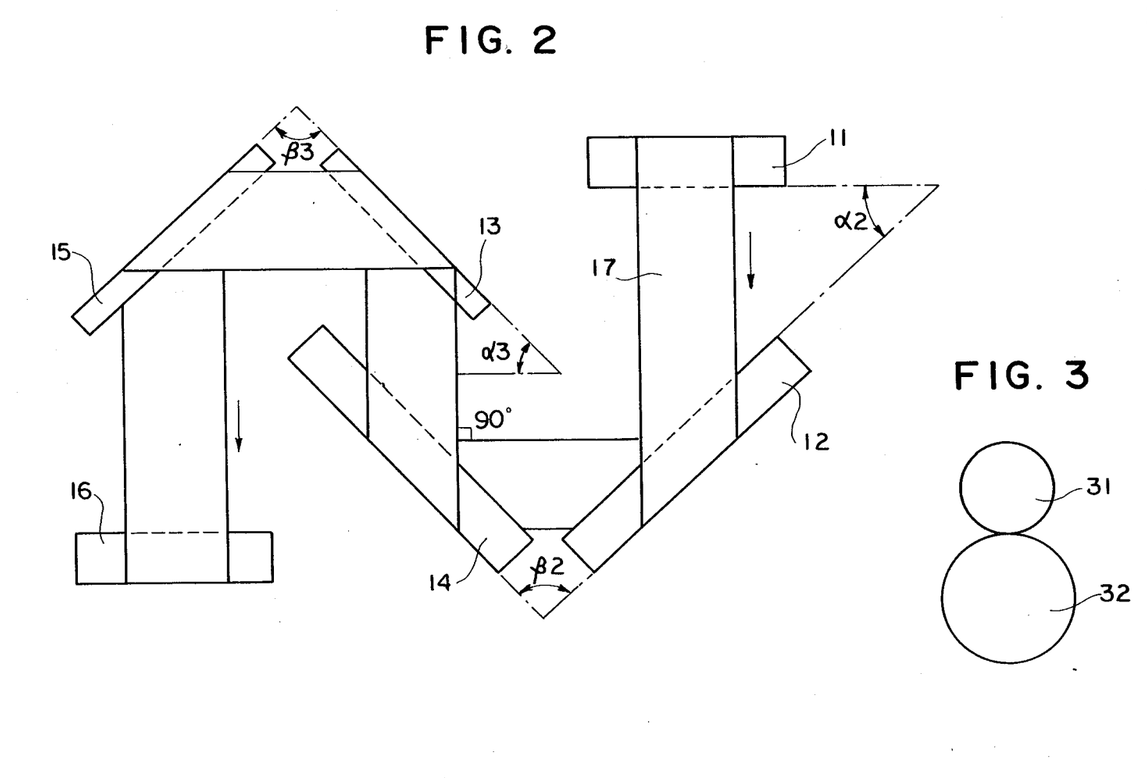
FIG. 3 is a schematic illustration depicting, as a simplified cross-section of a rotating roll in FIG. 1, a method for preventing the rotating roll from being deformed by a tensile force applied to a long substrate.

FIG. 2 is a schematic illustration showing by way of example the manner of practice of curl correction and dimensional-stability improvement by stretching a polyimide film by using as a first and second bars glass plates having a round-cornered rectangular cross-section such as that depicted in FIG. 8 and then correcting reverse curling, which has taken place with an associated metal foil inside, by using as a third bar and fourth bar glass plates having a round-cornered rectangular cross-section such as that illustrated in FIG. 8.

Namely, an A-FMCL 17 which has been wound on a roll 11 travels in a direction of an arrow and the side of a metal foil maintained in contact with a corner (the radius of curvature of the corner being smaller than 0.5 mm) of a first bar 12 arranged at $\alpha_2$ of 30–60 degrees, preferably, 40–50 degrees relative to the width of the substrate (in FIG. 2, $\alpha_2$ is set at 45 degrees), the substrate is turned at a turning angle, for example, 60 degrees. The substrate which has travelled past the first bar 12 then travels to a second bar 14 arranged at an angle of 60–120 degrees, preferably 70–110 degrees, especially 80–100 degrees relative to the first bar (in FIG. 2, $\beta_2 2$ is set at 90 degrees) and is turned at a turning angle of 60 degrees with the metal foil maintained in contact with a curved surface (the radius of curvature being 0.5 mm or smaller) of the second bar. The substrate which has travelled past the second bar 14 thereafter travels to a third bar 13 arranged at an angle of 30–60 degrees, preferably 35–55 degrees, most preferably 40–50 degrees relative to the width of the substrate (in FIG. 2, $\alpha_3$ is set at 45 degrees) and is turned at a turning angle of 60 degrees with the side of the polyimide maintained in contact with a corner (the radius of curvature of the corner portion being 0.5 radius 25 mm) of the third bar 13. The substrate which has travelled past the third bar 13 then travels to a fourth bar 15 arranged at an angle of 60–120 degrees, preferably 70–110 degrees, most preferably 80–100 degrees relative to the third bar (In FIG. 2, $\beta_3$ is set at 90 degrees) and is turned at a turning angle of 60 degrees with the polyimide side maintained in contact with its curved surface (the radius of curvature of the cornered portion being 0.5–25 mm). The substrate which has travelled past the fourth bar 15 travels further in a direction of an arrow and is taken up on a roll 16.

Figure 7:
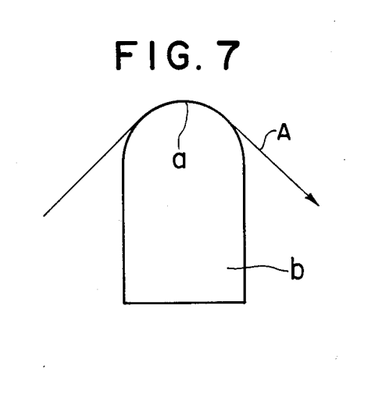
FIGS. 7 and 8 are respectively simplified cross-sections taken perpendicularly to the lengths of bars useful in a step of this invention.

The material of the bars employed respectively in the first, second, third and fourth steps of the present invention is a high-rigidity material such as glass, ceramic, metal or synthetic resin, most preferably, a strong ceramic such as zirconia ceramic, and their cross-sections (namely, cross-sections perpendicular to the lengths of the bars) may be of any desired shape such as rectangle, square or circle having a curve portion as shown in FIG. 7 or FIG. 8. Further, the radius of curvature of each curved surface where the metal foil of each A-FMCL is brought into contact with the respective bar is at least 0.01 mm but smaller than 0.5 mm, preferably, 0.1–0.45 mm, while the radius of curvature of each curved surface with which each polyimide layer is brought into contact is 0.01–25 mm. If the radius of curvature of the curved surface of the bar at which surface the bar contacts the metal foil is 0.5 mm or greater, the relative difference in stretching between the polyimide layer and metal foil layer is smaller when the long substrate travels under tension along the bar and in view of the principle of the present invention, it is impossible to obtain sufficient dimensional stability as a laminate for a circuit [in general, the size reduction (IPC FC 240) of the polyimide should be at least 0.1%]. On the other hand, any radii of curvature smaller than 0.01 mm may have a potential danger that a laminate could be damaged or cut upon its movement along the bar, and are hence not preferable.

If the radius of curvature of the portion of the bar at which portion the bar contacts the polyimide layer is 25 mm or greater, the bar cannot exhibit any deforming effects sufficient to correct plastic deformations of the metal foil fully. On the other hand, any radii of curvature of 0.01 mm and smaller are not preferred for the same reasons as mentioned above.

As the material for the rotating rolls employed to ensure smooth sliding of each laminate in the third and fourth steps of this invention, a metal, synthetic resin, ceramic or the like is employed. The radius of curvature of each rotating roll is 0.01–25 mm, preferably, 5–25 mm. The limitation to the radius of curvature is the same as that imposed in the case of the above-mentioned bars. Where a roll is subject to deformation by a tension applied to a laminate, a rotating roll 31 may be reinforced by an auxiliary roll 32 as shown in FIG. 3. The revolution number of each rotating roll may preferably be controlled in order to avoid any biasing of the advancing line of each substrate.

The term "turning angle" as used herein means an angle formed between a plane of a long A-FMCL fed in such a way that the A-FMCL is brought into contact with a bar or rotating roll and another plane of the substrate traveling after having been turned by its contact with the bar or rotating roll. Although no particular limitation is imposed on this angle, it may preferably be 20–160 degrees with 60–150 degrees being particularly preferred. If this angle is smaller than 20 degrees, it is generally difficult to permit smooth traveling for a laminate because a large resistance arises due to the frictional resistance and flexural rigidity of the laminate upon its traveling on the bar or rotating roll and the three-dimensional arrangement of the devices involves certain problems. If the angle is greater than 160 degrees, the laminate is allowed to contact only over a small length with the bar or rotating roll so that the stress of deformation to which the laminate is subjected becomes too small to correct the curled laminate and to improve its dimensional stability.

In addition, the contact between the A-FMCL and the curved surface of each of the first and second bars is effected while maintaining the A-FMCL under tension. The maintenance of such tension can be achieved by means of a known device which is adapted to apply a tension to the long laminate. Although a suitable range of tension varies depending on the degree of curling and dimensional stability of the laminate, the materials and thickness of the metal foil and polyimide layer, the radii of curvature of the bars, etc, the tension is usually greater than 200 g per cm of the width of A-FMCL and is preferably selected from a range of 300–1500 g. The tension of the A-FMCL upon its contact with the first and second rotating rolls or the third and fourth bars is similar to that of the A-FMCL upon its contact with the first and second bars but ay preferably be up to 2000 g/cm. If the tension applied to the laminate is 200 g/cm or smaller, the length of the laminate over which the laminate travels along the curved surface of each bar while the laminate is traveling on the bar becomes extremely short. As a result, the radius of curvature of a curved surface which the laminate draws on the bar increases so that the effects of this invention can hardly be brought about. A tension of 2000 g/cm or greater causes greater plastic deformations of the metal foil in the direction of the tension than plastic deformations of the polyimide layer, so that the improvement to the stability of the process is adversely affected.

No particular limitation is imposed on the speed of the long A-FMCL at which the long A-FMCL travels on the curved surface of each bar or rotating roll in the present invention. From the practical viewpoint, it may preferably be 0.2–10 m/min.

When aging is effected in the present invention, it may be conducted at a temperature of at least 100° C. for at least 30 minutes, preferably, at 140°–180° C. for 30–120 minutes. Although aging may be feasible at a temperature lower than 100° C., the development of its effects is slow. Any temperatures of 250° C. and higher lead to oxidation of the metal foil and a reduction to the bonding force and are hence not preferred.

The curl correction and dimensional stability improvement of this invention are effected preferably at a temperature of 200° C. or below. Although it is still possible to effect the curl correction and dimensional stability improvement at a temperature higher than 200° C., recurrence of curls and deterioration of the dimensional stability may take place in many instances due to a temperature change when the substrate is allowed to cool down to room temperature. It is hence not preferred to use such a high temperature. Therefore, a particularly preferred temperature range is 10°–50° C. When the process of this invention is practised in this manner, recurrence of curls and deterioration of the dimensional stability due to subsequent temperature changes can be controlled at ignorably low levels.

No particular limitation is imposed to the means employed for causing each laminate to travel to the bars or rotating rolls used in the first, second, third and fourth steps of the present invention. Controllers for correcting the advancing lines of each laminate when the laminate becomes astray from the advancing lines may be suitably chosen from various methods.

In accordance with the process of this invention for the correction of curls and the improvement to the dimensional stability, curls, which occur in a long A-

FMCL composed of a long metal foil and a thin film layer of an aromatic polyimide provided on one side of the metal foil without interposition of any adhesive layer therebetween, and its poor dimensional stability can be solved substantially. Owing to the omission of any adhesive layer, the processability of the A-FMCL for the formation of a circuit making good use of the excellent heat resistance, electrical properties and mechanical properties of the aromatic polyimide has been improved to a significant extent.

The present invention will hereinafter be described further by the following Examples and Comparative Examples.

EXAMPLE 1

In a vessel equipped with a stirrer, reflux condenser and nitrogen gas inlet tube, 221 g (0.60 mole) of 4,4'-bis(3-aminophenoxy)biphenyl and 280 g (1.4 moles) of 4,4'-diaminodiphenyl ether were dissolved in 3500 ml of N,N-dimethylacetamide. The contents were cooled to about 0° C., followed by an addition of 436 g (2.0 moles) of pyromellitic dianhydride in a nitrogen atmosphere. The contents were stirred around 0° C. for 2 hours. The temperature of the reaction mixture was thereafter allowed to return to room temperature, at which it was stirred for about 20 hours in a nitrogen atmosphere. The inherent viscosity of the resultant polyamide acid solution was 1.7 dl/g. The polyamide acid solution was diluted to 19% with N,N-dimethyl-acetamide to adjust its rotation viscosity to 120,00 cps.

The above solution was cast-coated evenly on a rolled copper foil (thickness: 35 μm). After drying the thus-coated foil at 130° C. for 5 minutes and at 160° C. for further 5 minutes, it was heated for 5 minutes in a nitrogen atmosphere of 270° C. (oxygen concentration: 3%) to obtain a polyimide-coated copper foil The film thickness was 25 μm. When the thus-obtained A-FMCL was cut into a square substrate of 24 cm×24 cm, a curl having a radius of curvature of 2.5 cm was involved with the polyimide layer inside in both T.D. and M.D. The dimensions of the polyimide film of the substrate with the copper foil contained therein were compared with those of the polyimide film alone obtained after etching the copper foil entirely with a conventional cupric chloride solution. Its dimensions after the etching of the copper foil decreased by 0.45% in both T.D. and M.D. compared with its dimensions before the etching. This dimensional decrease will hereinafter be called "size reduction".

The above-described long A-FMCL was slit to a width of 24 cm by a slitter and was then taken up on a take-up reel. The laminate was thereafter caused to travel. It was turned at a turning angle of 80 degrees with its copper foil side maintained in contact with a corner (the radius of curvature of the corner portion being 0.3 mm) of a first bar made of glass (see FIG. 1; fixed at an angle (line angle) of 45 degrees relative to the T.D. of the substrate, namely, $\alpha_1 = 45$ degrees; cross-section: rectangle of 20 mm wide and 100 mm long). The substrate which had travelled past the first bar was then turned at a turning angle of 100 degrees with the polyimide film maintained in contact with a first rotating roll made of stainless steel (see FIG. 1; fixed in a relation parallel to the first bar; radius of curvature: 5 mm). At this point, the laminate was caused to travel while applying a tension of 12 kg (namely, 0.5 kg/cm width) to it. The substrate was then caused to travel to a second bar (see FIG. 1; fixed at an angle (line angle) of 45 degrees relative to the T.D. of the substrate (namely, $\beta_1 = 45$ degrees; made of material similar to that of the first bar) and was turned at an angle of 80 degrees with its copper foil side maintained in contact with a corner of the second bar. The laminate was caused to travel from the second bar to a second rotating roll made of stainless steel (see FIG. 1; fixed in a relation parallel to the second bar; revolution number: controlled at 60% of the free rotation; radius of curvature: 5 mm) and was turned at a turning angle of 100 degrees with the polyimide film maintained in contact with the roll. At this point, the long laminate was caused to travel while by applying a tension of 12 kg (namely, 0.5 kg/cm width) thereto. These operations were performed at room temperature and the traveling speed of the substrate was 3 m/min. The above procedure was repeated twice. The substrate was thereafter taken up and aged for 60 minutes in a dryer of 150° C., followed by natural cooling.

The laminate obtained by the above operations was cut into square substrates of 24 cm×24 cm. The degree of their curling was investigated visually. No curling was observed. On the other hand, their size reduction was 0.08% in both T.D. and M.D.

COMPARATIVE EXAMPLE 1

The procedure of Example 1 was repeated except that the tension applied to the long laminate was 2.4 kg (namely, 0.1 kg/cm width). The laminate was cut into square substrates of 24 cm×24 cm. The degree of their curling was investigated but no curling was observed. However, their size reduction was 0.35% in both T.D. and M.D.

COMPARATIVE EXAMPLE 2

The procedure of Example 1 was repeated except that the radius of curvature of the corner of each bar to which corner the copper foil side was brought into contact was 5.0 mm. The laminate was cut into square substrates of 24 cm×24 cm and the degree of their curling was investigated. The radius of curvature of curling with the polyimide layer inside was about 10 cm in both T.D. and M.D. On the other hand, their size reduction was 0.40% in both T.D. and M.D.

EXAMPLE 2

In a vessel equipped with a stirrer, reflux condenser and nitrogen gas inlet tube, 234 g (0.80 mole) of 1,3-bis(3-aminophenoxy)benzene and 240 g (1.2 moles) of 4,4'-diaminodiphenyl ether were dissolved in 4500 ml of N,N-dimethylacetamide, followed by an addition of 644 g (2.0 moles) of 3,3',4,4'-benzoghenonetetracarboxylic dianhydride in a nitrogen atmosphere. The contents were stirred at 10° C. for 24 hours to obtain a polyamide acid solution. The inherent viscosity of the polyamide acid in the resultant solution was 1.5 dl/g. The polyamide acid solution was diluted to 15% with N,N-dimenthylacetamide to adjust its viscosity to 25,000 cps and was then coated evenly on a rolled copper foil (thickness: 35 μm) by means of a doctor blade. After drying the thus-coated copper foil at 130° C. for 60 minutes, it was heated for 60 minutes in a nitrogen atmosphere of 260° C. (oxygen concentration: 4%) to obtain a polyimide-coated copper foil. The film thickness was 25 μm. When the thus-obtained A-FMCL was cut into a square substrate of 24 cm×24 cm, a curl having a radius of curvature of 2.0 cm was involved with the polyimide layer inside in both T.D. and M.D. The size reduction of the polyimide film was 0.48%.

The above-described long A-FMCL was slit to a width of 24 cm by a slitter and was then taken up on a take-up reel. The laminate was thereafter caused to travel to a first bar made of glass (see FIG. 2; fixed at an angle (line angle) of 45 degrees relative to the T.D. of the laminate, namely, $\alpha_2=45$ degrees; cross-section: rectangle of 15 mm wide and 100 mm long) and was turned at a turning angle of 70 degrees with the copper foil side maintained in contact with its corner (radius of curvature of the corner portion: 0.4 mm) The substrate which had travelled past the first bar was then travelled to a second bar made of glass (see FIG. 2; arranged at an angle of 90 degrees relative to the first bar, namely, $\beta_2=90$ degrees; had the same shape as the first bar) and turned at a turning angle of 70 degrees with the copper foil side maintained in contact with the second bar. The tension applied to the laminate during its traveling along th corners of the first and second bars was 18 kg. The laminate which had been drawn from the second bar was thereafter caused to travel to a third bar made of glass (see FIG. 2; arranged in parallel to the second bar, namely, $\alpha_3=45$ degrees; cross-section: rectangle of 20 mm wide and 100 mm long; the portion at which the bar contacted the substrate: hemispherical having a radius of curvature of 5 mm) and was turned at a turning angle of 110 degrees with the polyimide side maintained in contact with the third bar. The laminate which had been drawn from the third bar was caused to travel to a fourth bar (see FIG. 2; arranged at an angle of 90 degrees relative to the third bar, namely, $\beta_3=90$ degrees; had the same shape as the third bar) and was turned at a turning angle of 110 degrees with the polyimide side maintained in contact with the bar. The tension applied to the laminate during its traveling along the corners of the first and second bars was 12 kg. These operations were performed at room temperature and the traveling speed of the laminate was 1 m/min. The above procedure was repeated three times. The laminate obtained by the above operations was cut into square substrates of 24 cm × 24 cm. The degree of their curling was investigated but no curling was observed. On the other hand, their size reduction was 0.07% in both T.D. and M.D.

COMPARATIVE EXAMPLE 3

The procedure of Example 2 was repeated except that the first bar made of glass was fixed at a line angle of 20 degrees relative to the T.D. of the laminate, the second bar was arranged at an angle of 40 degrees relative to the first bar, the third bar was arranged in parallel to the second bar, and the fourth bar was arranged at an angle of 40 degrees relative to the third bar. The laminate was cut into square substrates of 24 cm × 24 cm and the degree of their curling was investigated. As a result, no curling was observed in the M.D. but slight curling having a radius of curvature of about 20 cm was observed in the T.D. On the other hand, their size reduction was 0.06% in M.D. but 1.6% in T.D.

EXAMPLE 3

In a vessel equipped with a stirrer, reflux condenser and nitrogen gas inlet tube, 421 g (2.1 moles) of 4,4'-diaminodiphenyl ether was dissolved in 4000 ml of N-methylpyrrolidone, followed by an addition of 458 g (2.1 moles) of pyromellitic dianhydride in a nitrogen atmosphere. The contents were stirred at room temperature for 24 hours. The inherent viscosity of the resultant polyamide acid solution was 1.8 dl/g. The polyamide acid solution was diluted to 16% with N-menthylpyrrolidone to adjust its rotational viscosity to 110,000 cps.

The solution was cast-coated evenly on a high-ductile electrolytic copper foil (Mitsui Mining & Smelting Co., Ltd.; THE Copper Foil; Thickness: 18 $\mu$m). After drying the thus-coated copper foil at 130° C. for 5 minutes and at 180° C. for further 5 minutes, it was heated for 5 minutes in a nitrogen atmosphere of 300° C. (oxygen concentration: 2%) to obtain a polyimide-coated copper foil. The film thickness was 25 $\mu$m. When the thus-obtained A-FMCL was cut into a square substrate of 24 cm × 24 cm, a curl having a radius of curvature of 1.5 cm was involved with the polyimide layer inside in both T.D. and M.D. The size reduction was 0.55%.

The above-described long A-FMCL was slit to a width of 24 cm by a slitter and and its curl correction and dimensional stability improvement were carried out in the same manner as in Example 1. The resultant laminate was cut into square laminates of 24 cm × 24 cm and the degree of their curling was investigated. No curling was observed. On the other hand, their size reduction was 0.10% in both T.D. and M.D.

EXAMPLE 4

The procedure of Example 2 was repeated except that toughened zirconia ceramic bars (cross-section: rectangle of 0.6 mm wide and 30 mm long; one end of the rectangle where the bars contacted the copper foil side: hemispherical with a radius of curvature of 0.3 mm) were used in place of the first and second bars made of glass, toughened zirconia ceramic bars (cross-section: rectangle of 1.0 mm wide and 30 mm long; one end of the rectangle where the bars contacted the polyimide side: hemispherical with a radius of curvature of 0.5 mm) were used in place of the third and fourth bars made of glass, the turning angles at which the laminate was turned with its polyimide side maintained in contact with the corners of the third and fourth bars respectively was set at 150 degrees, and the operation was repeated twice. The resultant laminate was cut into square laminates of 24 cm × 24 cm and the degree of their curling was investigated. No curling was observed. On the other hand, their size reduction was 0.05% in both T.D. and M.D.

We claim:

1. A process for the correction of curls of a long flexible metal clad laminate, which has a thin aromatic polyimide film formed directly on a long metal foil without any adhesive interposed therebetween, and for the improvement of the dimensional stability thereof, characterized in that said process comprises the steps, performed at least once per step in any arbitrary order, of (1) causing the laminate to slide under tension, along the length thereof, on a curved surface of a first bar arranged at an angle of 30–60 degrees relative to the width of the laminate with the metal foil inside so that the metal foil faces said first bar; (2) causing the laminate to slide under tension, along the length thereof, with the metal foil inside, on a curved surface of a second bar arranged at an angle of 60–120 degrees relative to the first bar; (3) causing the laminate to slide under tension, along the length thereof, with the polyimide film inside, on a curved surface of a third bar or first rotating roll arranged at an angle of 30–60 degrees relative to the width of the laminate; and (4) causing the laminate to slide under tension, along the length thereof, with the polyimide film inside, on a curved surface of a fourth bar or second rotating roll arranged at an angle of 60-120 degrees relative to the third bar or first rotating roll.

2. The process as claimed in claim 1, wherein in the first and second steps, the radii of curvature of the curved surfaces of the first and second bars are smaller than 0.5 mm, each tension is expressed in terms of a tensile force applied to the laminate and is greater than 200 g/cm, and the temperature of the laminate during its sliding movement on the curved surfaces of the first and second bars remain 200° C. or lower, and in the third and fourth steps, the radii of curvature of the curved surfaces of the third and fourth bars or first and second rotating rolls are 0.01-25 mm, the tensile force applied to the laminate is 2000 g/cm or smaller, and the temperature of the laminate during its sliding movement on the curved surfaces of the third and fourth bars or first and second rotating rolls remain 200° C. or lower.

3. The process as claimed in claim 1, wherein the steps are performed in the order of the first, second, third and fourth steps and each of the steps is performed at least once.

4. The process as claimed in claim 1, wherein the steps are performed in the order of the first, third, second and fourth steps and each of the steps is performed at least once.

5. The process as claimed in claim 2, wherein the steps are performed in the order of the first, second, third and fourth steps and each of the steps is performed at least once.

6. The process as claimed in claim 2, wherein the steps are performed in the order of the first, third, second and fourth steps and each of the steps is performed at least once.

7. The process as claimed in claim 1, wherein after completion of the last step, the resultant laminate is aged at a temperature of at least 100° C. for at least 30 minutes.

8. The process as claimed in claim 2, wherein after completion of the last step, the resultant laminate is aged at a temperature of at least 100° C. for at least 30 minutes.

* * * * *